United States Patent
Ramalingam et al.

(10) Patent No.: US 9,461,137 B1
(45) Date of Patent: Oct. 4, 2016

(54) TUNGSTEN SILICIDE NITRIDE FILMS AND METHODS OF FORMATION

(71) Applicant: APPLIED MATERIALS, INC., Santa Clara, CA (US)

(72) Inventors: Jothilingam Ramalingam, Sunnyvale, CA (US); Rajkumar Jakkaraju, San Jose, CA (US); Jianxin Lei, Fremont, CA (US); Zhiyong Wang, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/938,559

(22) Filed: Nov. 11, 2015

Related U.S. Application Data (60) Provisional application No. 62/217,443, filed on Sep. 11, 2015.

(51) Int. Cl.
  *H01L 21/336* (2006.01)
  *H01L 29/49* (2006.01)
  *H01L 21/285* (2006.01)
  *H01L 21/28* (2006.01)

(52) U.S. Cl.
  CPC ....... *H01L 29/4975* (2013.01); *H01L 21/2855* (2013.01); *H01L 21/28088* (2013.01); *H01L 21/28518* (2013.01)

(58) Field of Classification Search
  USPC ........................................................ 257/412
  See application file for complete search history.

(56) References Cited

U.S. PATENT DOCUMENTS

| | | | | |
|---|---|---|---|---|
| 6,303,483 B1* | 10/2001 | Kunikiyo | ......... | H01L 21/28061 257/E21.2 |
| 6,723,652 B1* | 4/2004 | Fukuda | ............. | H01L 21/32136 257/E21.206 |
| 8,258,545 B1* | 9/2012 | Huang | ................ | H01L 29/7378 257/197 |
| 2003/0211673 A1* | 11/2003 | Nakamura | ........ | H01L 21/28518 438/197 |
| 2008/0179597 A1* | 7/2008 | Yamazaki | ........... | H01L 27/1233 257/59 |

OTHER PUBLICATIONS

Marques, et al., "Structural and Mechanical Properties of Amorphous W-Si-N Sputtered Films After Thermal Annealing", Thin Solid Films 441 (2003) pp. 150-160.

(Continued)

*Primary Examiner* — Thao P Le
(74) *Attorney, Agent, or Firm* — Moser Taboada; Alan Taboada

(57) ABSTRACT

Embodiments of the present disclosure include tungsten silicide nitride films and methods for depositing tungsten silicide nitride films. In some embodiments, a thin film microelectronic device includes a semiconductor substrate having a tungsten gate electrode stack comprising a tungsten silicide nitride film having a formula $W_xSi_yN_z$, wherein x is about 19 to about 22 atomic percent, y is about 57 to about 61 atomic percent, and z is about 15 to about 20 atomic percent. In some embodiments, a method of processing a substrate disposed in physical vapor deposition (PVD) chamber, includes: exposing a substrate having a gate insulating layer to a plasma formed from a first process gas comprising nitrogen and argon; sputtering silicon and tungsten material from a target disposed within a processing volume of the PVD chamber; depositing atop the gate insulating layer a tungsten silicide nitride layer as described above; and depositing a bulk tungsten layer atop the tungsten silicide nitride layer.

20 Claims, 3 Drawing Sheets

(56) References Cited

OTHER PUBLICATIONS

Qu, et al., "Effects of Preannealing on the Diffusion Barrier Properties for Ultrathin W-Si-N Thin Film", Thin Solid Films 462-463 (2004) pp. 67-71.

Musil, et al., "Properties of Reactively Sputtered W-Si-N Films", Surface & Coatings Technology 200 (2006) pp. 3886-3895.

Volmiero, et al., "Structural Properties of Reactively Sputtered W-Si-N Thin Films", Journal of Applied Physics 102 033505 (2007).

* cited by examiner

TUNGSTEN SILICIDE NITRIDE FILMS AND METHODS OF FORMATION

CROSS-REFERENCE TO RELATED APPLICATIONS

This application claims benefit of U.S. provisional patent application Ser. No. 62/217,443, filed Sep. 11, 2015, which is herein incorporated by reference in its entirety.

FIELD

Embodiments of the present disclosure generally relate to substrate processing systems and methods, and more particularly to tungsten silicide nitride films and methods for depositing tungsten silicide nitride films.

BACKGROUND

In the manufacture of integrated circuits, including dynamic random access memory (DRAM), tungsten (W) is frequently used as a gate conductor material. However, the integration of tungsten into semiconductor processing involves a number of significant challenges. For example, typical fabrication of a tungsten gate electrode stack involves forming a gate oxide layer on a silicon substrate such as by thermal oxidation or chemical vapor deposition (CVD). A subsequently deposited bulk tungsten film has a relatively poor adhesion to the gate oxide layer. Thus, an adhesion layer (i.e., a glue layer), such as tungsten silicide (WSi) or tungsten nitride (WN) is deposited onto the gate oxide layer prior to depositing the bulk tungsten film. However, the inventors have observed that the adhesion layer often exhibits unsatisfactory adhesion to the underlying oxide and the subsequently deposited bulk tungsten material and also fails to provide suitable resistivity of the gate stack.

Accordingly, the inventors have provided improved tungsten silicide nitride films and methods for depositing tungsten silicide nitride films useful, in a non-limiting example, for an adhesion layer in DRAM applications.

SUMMARY

Embodiments of the present disclosure include tungsten silicide nitride films and methods for depositing tungsten silicide nitride films. In some embodiments, a thin film microelectronic device includes a substrate having a tungsten gate electrode stack comprising a tungsten silicide nitride film having a formula $W_xSi_yN_z$, wherein x is about 19 to about 22 atomic percent, y is about 57 to about 61 atomic percent, and z is about 15 to about 20 atomic percent.

In some embodiments, a method of processing a substrate disposed in physical vapor deposition (PVD) chamber, includes: exposing a substrate having a gate insulating layer to a plasma formed from a first process gas comprising nitrogen and argon; sputtering silicon and tungsten material from a target disposed within a processing volume of the PVD chamber; depositing atop the gate insulating layer a tungsten silicide nitride layer having a formula $W_xSi_yN_z$, wherein x is about 19 to about 22 atomic percent, y is about 57 to about 61 atomic percent, and z is about 15 to about 20 atomic percent; and depositing a bulk tungsten layer atop the tungsten silicide nitride layer.

In some embodiments, a computer readable medium, having instructions stored thereon which, when executed, cause a physical vapor deposition process chamber to perform a method of processing a substrate disposed atop a substrate support within the physical vapor deposition process chamber are provided herein. The method may include any of the embodiments disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The present disclosure relates to tungsten silicide nitride films and methods for depositing tungsten silicide nitride films. In at least some embodiments, the inventive films and methods described herein advantageously reduce or eliminate peeling of tungsten deposited to form a tungsten gate electrode stack while maintaining suitable resistivity of the gate stack and maintaining substantially neutral substrate stress.

Figure 1:
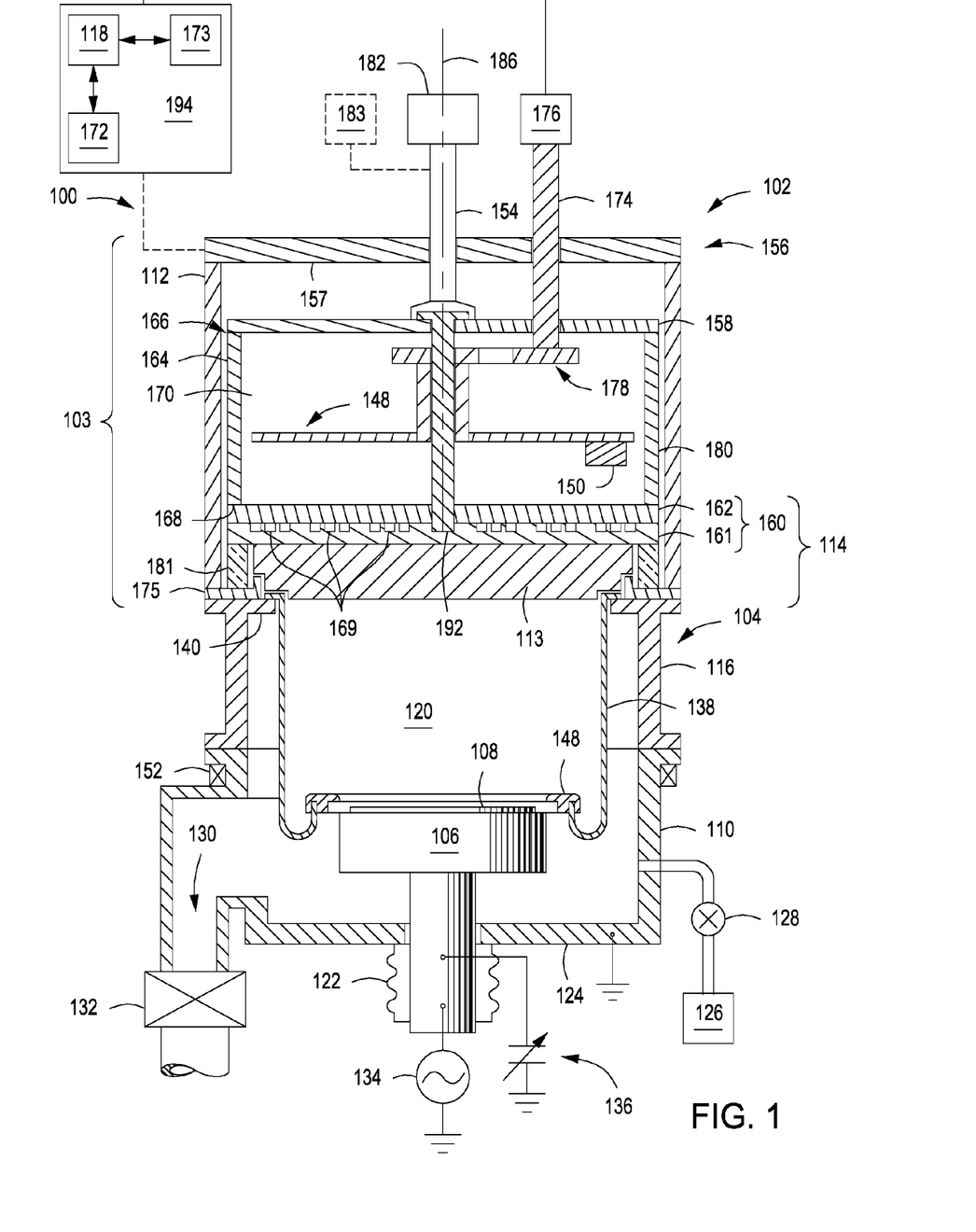
FIG. 1 depicts a schematic cross sectional view of a process chamber in accordance with some embodiments of the present disclosure.
Figure 2:
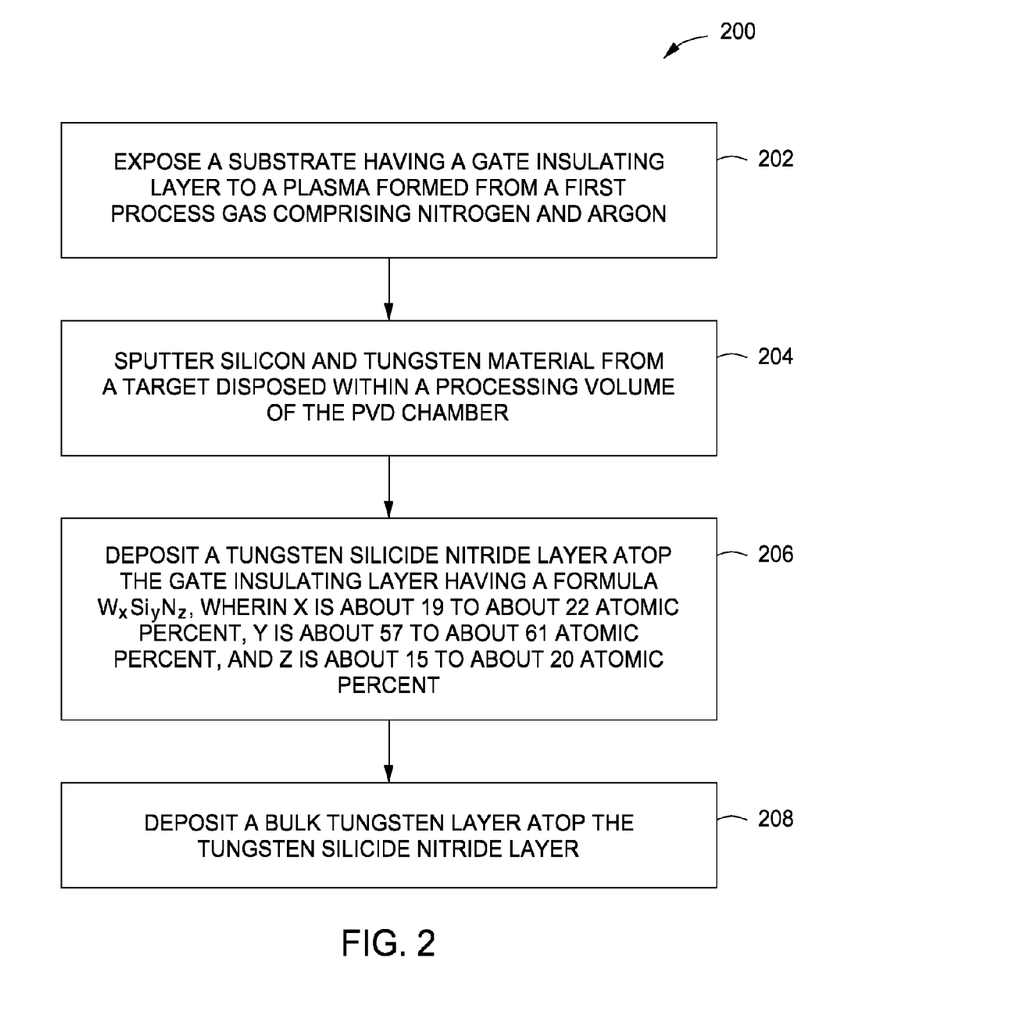
FIG. 2 depicts a flowchart of a method of processing a substrate in accordance with some embodiments of the present disclosure.

FIG. 1 depicts a simplified, cross-sectional view of an illustrative physical vapor deposition (PVD) processing system 100, in accordance with some embodiments of the present disclosure. FIG. 2 depicts a flow chart of a method 200 for depositing a dielectric layer atop a substrate disposed in a physical vapor deposition process system of the type described in FIG. 1. The method 200 is described below with respect to the stages of processing a substrate as depicted in FIGS. 3A-3D. Examples of PVD chambers suitable for performing the method 200 described herein include the CIRRUS™, AVENIR™ and IMPULSE PVD processing chambers, all commercially available from Applied Materials, Inc., of Santa Clara, Calif.

The process chamber 104 depicted in FIG. 1 comprises a substrate support 106, a target assembly 114 having an optional backing plate assembly 160 and source material 113 which is disposed on a substrate support facing side of the backing plate assembly 160. Additional details relating to the illustrative PVD processing system 100 are discussed below.

Embodiments of the disclosure describe a thin film microelectronic device comprising a substrate, such as a semiconductor substrate, having a tungsten gate electrode stack disposed thereon. A tungsten gate electrode stack typically comprises a gate oxide layer, an adhesion layer disposed atop the gate oxide layer and a bulk tungsten layer disposed atop the adhesion layer. Typically, the adhesion layer is titanium nitride, tungsten nitride or tungsten silicide. Typically, the bulk tungsten layer has a thickness of about 200 angstroms to about 250 angstroms. However, the inventors have observed that when depositing a thick bulk tungsten layer, for example about 2000 to about 5000 angstroms, an adhesion layer of tungsten nitride or tungsten silicide results in peeling of the tungsten bulk layer from atop the tungsten gate electrode stack, while the difference in grain size between the bulk tungsten layer and a titanium nitride adhesion layer results in poor stack resistivity (i.e. a stack resistivity of about 7.5 μ'Ω-cm or greater).

Thus, the inventors have provided an adhesion layer that reduces or eliminates peeling of the bulk tungsten layer, and which provides good electrical resistivity, and neutral stress. The inventors have observed that depositing a tungsten silicide layer as an adhesion layer advantageously reduces or eliminates peeling of the bulk tungsten layer while providing a tungsten gate electrode stack resistivity of about 7.17 to about 7.27 μ'Ω-cm, which is within a suitable range of the resistivity of the tungsten gate electrode stack without the tungsten silicide nitride layer (i.e. about 6.85 μ'Ω-cm).

Figure 3A:
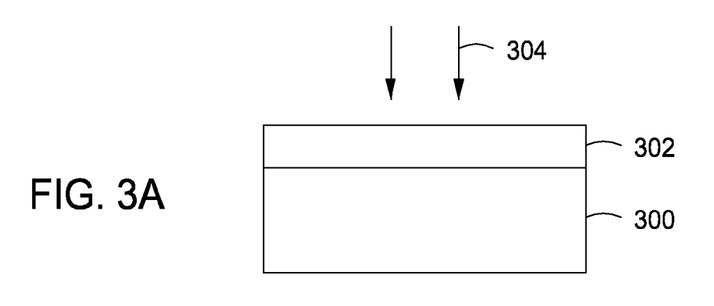
FIGS. 3A-3D depict the stages of processing a substrate in accordance with some embodiments of the present disclosure.

The method 200 begins at 202, and as depicted in FIG. 3A, by exposing a substrate 300 having a gate insulating layer 302 to a plasma 304 formed from a first process gas comprising nitrogen and argon. In some embodiments, the substrate 300 may be composed of p-doped silicon, n-doped silicon, silicon-on-insulator or other suitable substrate materials. In some embodiments, the gate insulating layer 302 may be composed of oxide, silicon nitride, laminates of these or other well-known gate insulating film materials and may be fabricated by oxidation, CVD or other well-known techniques.

In some embodiments, the first process gas comprises about 3 sccm to about 10 sccm of nitrogen. The inventors performed numerous experiments to determine the proper range of nitrogen to provide the features of the adhesion layer described above. The inventors observed that adding less than about 3 sccm of nitrogen to the process gas failed to eliminate peeling of the subsequently deposited bulk tungsten layer. The inventors observed that adding about 3 sccm to about 10 sccm of nitrogen to the process gas eliminated peeling and provided the stack resistivity described above; however increasing the nitrogen flow rate above about 5 sccm resulted in undesirable compressive stresses on the tungsten gate electrode stack. Accordingly, in some embodiments, the first process gas comprises about 3 sccm to about 5 sccm of nitrogen. The inventors observed that adding about 3 sccm to about 5 sccm of nitrogen to the process gas eliminates peeling and provides the stack resistivity described above and provides a substantially neutral stress on the tungsten gate electrode stack. In some embodiments, the first process gas comprises about 40 sccm to about 45 sccm of argon. In some embodiments, forming the plasma 304 comprises applying about 500 to about 800 Watts of DC power to the target.

Next at 204, silicon and tungsten material is sputtered from a target disposed within a processing volume of the PVD chamber, such as the physical vapor deposition (PVD) processing system 100 depicted in FIG. 1. In some embodiments, the target has a composition of about 33 wt % tungsten and about 66 wt. % silicon.

Figure 3B:
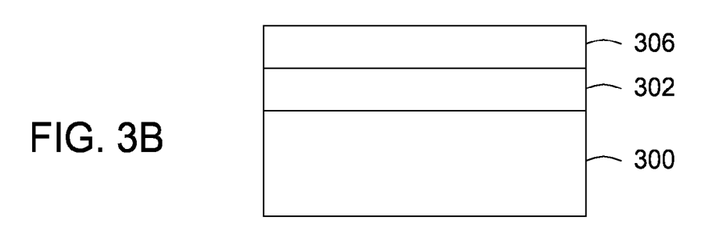

Next at 206, as depicted in FIG. 3B, a tungsten silicide nitride adhesion layer 306 is deposited atop the gate insulating layer 302. The tungsten silicide nitride adhesion layer 306 contains a sufficient amount of unbonded silicon atoms which adhere to the underlying gate insulating layer 302, a sufficient amount of tungsten silicide to which the subsequently deposited bulk tungsten layer described below readily adheres, and a sufficient amount of nitrogen to control peeling and maintain the gate stack at substantially neutral stress. The inventors observed that while too little concentration of nitrogen fails to improve adhesion, too large of a concentration of nitrogen in the tungsten silicide nitride adhesion layer 306 improved adhesion but also undesirably increased stack resistivity. Accordingly, the inventors have observed that a tungsten silicide nitride adhesion layer 306 having the formula $W_xSi_yN_z$, wherein x is about 19 to about 22 atomic percent, y is about 57 to about 61 atomic percent, and z is about 15 to about 20 atomic percent advantageously reduces or eliminates peeling of subsequently deposited bulk tungsten material while maintaining suitable resistivity of the gate stack and maintaining substantially neutral stress of the gate stack. In some embodiments, the thickness of the tungsten silicide nitride adhesion layer 306 is about 20-50 angstroms.

Figure 3C:
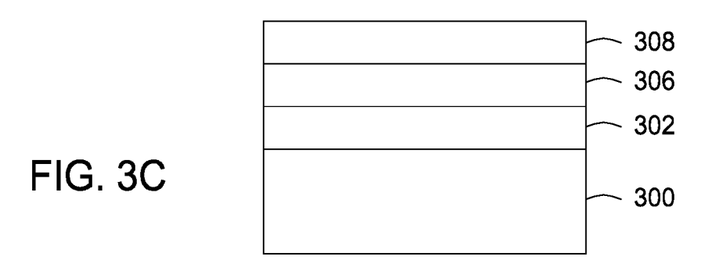

Next at 208, and as depicted in FIG. 3C, a bulk tungsten layer 308 is deposited atop the tungsten silicide nitride adhesion layer 306. In some embodiments, the thickness of the bulk tungsten layer is about 2000 to about 5000 angstroms. The inventors have observed that traditional adhesion layers suitable for thinner bulk tungsten material, for example about 200 to about 250 angstroms, fail to provide adequate adhesion for a thicker bulk tungsten layer of about 2000 to about 5000 Angstroms. In some embodiments, the bulk tungsten layer 308 is deposited by a suitable PVD deposition process. In some embodiments, the PVD deposition process utilizes a plasma formed from a process gas, such as argon, to sputter material from a tungsten target. In some embodiments, the plasma is formed by applying a DC source power to the target, for example a source power of about 1600 to about 2000 watts. In some embodiments, a bias power of about 300 to about 400 watts is applied to the substrate 300.

Figure 3D:
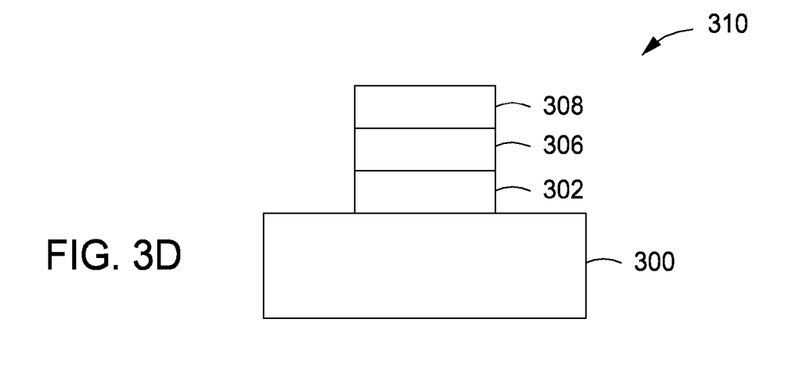

Following deposition of the bulk tungsten layer 308, the method 200 generally ends and the substrate 300 may proceed for further processing. In some embodiments, subsequent processes such as deposition, etch, annealing, or the like may be performed to fabricate a finished device, such as a memory device. For example, following the method 200, a suitable lithographic mask composed of suitable resist or other masking materials is patterned to yield a predetermined shape of the tungsten gate electrode stack 310 as depicted in FIG. 3D. The bulk tungsten layer 308, the underlying tungsten silicide nitride adhesion layer 306 and the gate insulating layer 302 are etched using any suitable etch process, for example a fluorinated plasma etch process, to yield the tungsten gate electrode stack 310 depicted in FIG. 3D.

Returning to FIG. 1, a second energy source 183, optionally coupled to the target assembly 114, may provide DC power to the target assembly 114 to direct the plasma towards the target assembly 114. In some embodiments, the DC power may range from about 200 W to about 20 kilowatts (kW), although the amount of DC power applied may vary depending upon chamber geometry (e.g., target size or the like). In some embodiments, the DC power may also be adjusted over the life of the target in the same manner as described above for the RF power. The DC power may be adjusted to control the deposition rate of sputtered metal atoms on the substrate. For example, increasing the DC power can result in increased interaction of the plasma with the source material 113 and increased sputtering of metal atoms from the target assembly 114.

The PVD processing system 100 includes a chamber lid 102 removably disposed atop a process chamber 104. The chamber lid 102 may include the target assembly 114 and a grounding assembly 103. The process chamber 104 contains a substrate support 106 for receiving a substrate 108. The substrate support 106 may be located within a lower grounded enclosure wall 110, which may be a chamber wall of the process chamber 104. The lower grounded enclosure wall 110 may be electrically coupled to the grounding assembly 103 of the chamber lid 102 such that an RF return path is provided to an RF power source 182 disposed above the chamber lid 102. The RF power source 182 may provide RF energy to the target assembly 114 as discussed below. Alternatively or in combination a DC power source may be similarly coupled to target assembly 114.

The PVD processing system 100 may include a source distribution plate 158 opposing a backside of the target assembly 114 and electrically coupled to the target assembly 114 along a peripheral edge of the target assembly 114. The PVD processing system 100 may include a cavity 170 disposed between the backside of the target assembly 114 and the source distribution plate 158. The cavity 170 may at least partially house a magnetron assembly 196 as discussed below. The cavity 170 is at least partially defined by the inner surface of a conductive support ring 164, a target facing surface of the source distribution plate 158, and a source distribution plate facing surface (e.g., backside) of the target assembly 114 (or backing plate assembly 160).

The PVD processing system 100 further includes a magnetron assembly. The magnetron assembly provides a rotating magnetic field proximate the target assembly 114 to assist in plasma processing within the process chamber 104. The magnetron assembly includes a rotatable magnet assembly 148 disposed within the cavity 170. The rotatable magnet assembly 148 rotates about a central axis 186 of the process chamber 104.

In some embodiments, the magnetron assembly includes a motor 176, a motor shaft 174, a gear assembly 178, and the rotatable magnet assembly 148. The rotatable magnet assembly 148 includes a plurality of magnets 150 and is configured to rotate the plurality of magnets 150 about the central axis 186 as described below. The motor 176 may be an electric motor, a pneumatic or hydraulic drive, or any other process-compatible mechanism that can provide suitable torque. While one illustrative embodiment is described herein to illustrate how the rotatable magnet assembly 148 may be rotated, other configurations may also be used.

In use, the magnetron assembly rotates the rotatable magnet assembly 148 within the cavity 170. For example, in some embodiments, the motor 176, motor shaft 174, and gear assembly 178 may be provided to rotate the rotatable magnet assembly 148. In some embodiments, the electrode 154 is aligned with the central axis 186 of the process chamber 104, and motor shaft 174 of the magnetron may be disposed through an off-center opening in the ground plate 156. The end of the motor shaft 174 protruding from the ground plate 156 is coupled to the motor 176. The motor shaft 174 is further disposed through an off-center opening in the source distribution plate 158 and coupled to a gear assembly 178.

The gear assembly 178 may be supported by any suitable means, such as by being coupled to a bottom surface of the source distribution plate 158. The gear assembly 178 may be insulated from the source distribution plate 158 by fabricating at least the upper surface of the gear assembly 178 from a dielectric material, or by interposing an insulator layer (not shown) between the gear assembly 178 and the source distribution plate 158, or the like, or by constructing the motor shaft 174 out of suitable dielectric material. The gear assembly 178 is further coupled to the rotatable magnet assembly 148 to transfer the rotational motion provided by the motor 176 to the rotatable magnet assembly 148. The gear assembly 178 may be coupled to the rotatable magnet assembly 148 through the use of pulleys, gears, or other suitable means of transferring the rotational motion provided by the motor 176.

The substrate support 106 has a material-receiving surface facing a principal surface of a target assembly 114 and supports the substrate 108 to be sputter coated in planar position opposite to the principal surface of the target assembly 114. The substrate support 106 may support the substrate 108 in a processing region 120 of the process chamber 104. The processing region 120 is defined as the region above the substrate support 106 during processing (for example, between the target assembly 114 and the substrate support 106 when in a processing position).

In some embodiments, the substrate support 106 may be vertically movable to allow the substrate 108 to be transferred onto the substrate support 106 through a load lock valve (not shown) in the lower portion of the process chamber 104 and thereafter raised to a deposition, or processing position. A bellows 122 connected to a bottom chamber wall 124 may be provided to maintain a separation of the inner volume of the process chamber 104 from the atmosphere outside of the process chamber 104 while facilitating vertical movement of the substrate support 106. One or more gases may be supplied from a gas source 126 through a mass flow controller 128 into the lower part of the process chamber 104. An exhaust port 130 may be provided and coupled to a pump (not shown) via a valve 132 for exhausting the interior of the process chamber 104 and to facilitate maintaining a suitable pressure inside the process chamber 104.

The process chamber 104 further includes a process kit shield, or shield, 138 to surround the processing volume, or central region, of the process chamber 104 and to protect other chamber components from damage and/or contamination from processing. In some embodiments, the shield 138 may be connected to a ledge 140 of an upper grounded enclosure wall 116 of the process chamber 104. As illustrated in FIG. 1, the chamber lid 102 may rest on the ledge 140 of the upper grounded enclosure wall 116. Similar to the lower grounded enclosure wall 110, the upper grounded enclosure wall 116 may provide a portion of the RF return path between the lower grounded enclosure wall 116 and the grounding assembly 103 of the chamber lid 102. However, other RF return paths are possible, such as via the grounded shield 138.

The shield 138 extends downwardly and may include a generally tubular portion having a generally constant diameter that generally surrounds the processing region 120. The shield 138 extends along the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the shield 138). A cover ring 146 rests on the top of an upwardly extending inner portion of the shield 138 when the substrate support 106 is in the lower, loading position but rests on the outer periphery of the substrate support 106 when the substrate support is in the upper, deposition position to protect the substrate support 106 from sputter deposition. An additional deposition ring (not shown) may be used to protect the edges of the substrate support 106 from deposition around the edge of the substrate 108.

In some embodiments, a magnet 152 may be disposed about the process chamber 104 for selectively providing a magnetic field between the substrate support 106 and the target assembly 114. For example, as shown in FIG. 1, the magnet 152 may be disposed about the outside of the enclosure wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber lid 102 generally includes the grounding assembly 103 disposed about the target assembly 114. The grounding assembly 103 may include a grounding plate 156 having a first surface 157 that may be generally parallel to and opposite a backside of the target assembly 114. A grounding shield 112 may extending from the first surface 157 of the grounding plate 156 and surround the target assembly 114. The grounding assembly 103 may include a support member 175 to support the target assembly 114 within the grounding assembly 103.

In some embodiments, the support member 175 may be coupled to a lower end of the grounding shield 112 proximate an outer peripheral edge of the support member 175 and extends radially inward to support a seal ring 181, and the target assembly 114. The seal ring 181 may be a ring or other annular shape having a suitable cross-section. The seal ring 181 may include two opposing planar and generally parallel surfaces to facilitate interfacing with the target assembly 114, such as the backing plate assembly 160, on a first side of the seal ring 181 and with the support member 175 on a second side of the seal ring 181. The seal ring 181 may be made of a dielectric material, such as ceramic. The seal ring 181 may insulate the target assembly 114 from the ground assembly 103.

The support member 175 may be a generally planar member having a central opening to accommodate the target assembly 114. In some embodiments, the support member 175 may be circular, or disc-like in shape, although the shape may vary depending upon the corresponding shape of the chamber lid and/or the shape of the substrate to be processed in the PVD processing system 100.

The target assembly 114 may comprise a source material 113, such as a metal, metal oxide, metal alloy, or the like, to be deposited on a substrate, such as the substrate 108 during sputtering. In some embodiments, the target assembly 114 may be fabricated substantially from the source material 113, without any backing plate to support the source material 113. In some embodiments, the target assembly 114 includes a backing plate assembly 160 to support the source material 113. The source material 113 may be disposed on a substrate support facing side of the backing plate assembly 160 as illustrated in FIG. 1. The backing plate assembly 160 may comprise a conductive material, such as copper-zinc, copper-chrome, or the same material as the target, such that RF and DC power can be coupled to the source material 113 via the backing plate assembly 160. Alternatively, the backing plate assembly 160 may be non-conductive and may include conductive elements (not shown) such as electrical feedthroughs or the like.

In some embodiments, the backing plate assembly 160 includes a first backing plate 161 and a second backing plate 162. The first backing plate 161 and the second backing plate 162 may be disc shaped, rectangular, square, or any other shape that may be accommodated by the PVD processing system 100. A front side of the first backing plate 161 is configured to support the source material 113 such that a front surface of the source material opposes the substrate 108 when present. The source material 113 may be coupled to the first backing plate 161 in any suitable manner. For example, in some embodiments, the source material 113 may be diffusion bonded to the first backing plate 161.

A plurality of sets of channels 169 may be disposed between the first backing plate 161 and second backing plate 162. The first backing plate 161 and second backing plate 162 may be coupled together to form a substantially water tight seal (e.g., a fluid seal between the first and second backing plates) to prevent leakage of coolant provided to the plurality of sets of channels 169. In some embodiments, the target assembly 114 may further comprise a central support member 192 to support the target assembly 114 within the process chamber 104.

In some embodiments, the conductive support ring 164 may be disposed between the source distribution plate 158 and the backside of the target assembly 114 to propagate RF energy from the source distribution plate to the peripheral edge of the target assembly 114. The conductive support ring 164 may be cylindrical, with a first end 166 coupled to a target-facing surface of the source distribution plate 158 proximate the peripheral edge of the source distribution plate 158 and a second end 168 coupled to a source distribution plate-facing surface of the target assembly 114 proximate the peripheral edge of the target assembly 114. In some embodiments, the second end 168 is coupled to a source distribution plate facing surface of the backing plate assembly 160 proximate the peripheral edge of the backing plate assembly 160.

An insulative gap 180 is provided between the grounding plate 156 and the outer surfaces of the source distribution plate 158, the conductive support ring 164, and the target assembly 114 (and/or backing plate assembly 160). The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 may be between about 15 mm and about 40 mm.

The grounding assembly 103 and the target assembly 114 may be electrically separated by the seal ring 181 and by one or more of insulators (not shown) disposed between the first surface 157 of the grounding plate 156 and the backside of the target assembly 114, e.g., a non-target facing side of the source distribution plate 158.

The PVD processing system 100 has an RF power source 182 connected to an electrode 154 (e.g., a RF feed structure). The electrode 154 may pass through the grounding plate 156 and is coupled to the source distribution plate 158. The RF power source 182 may include an RF generator and a matching circuit, for example, to minimize reflected RF energy reflected back to the RF generator during operation. For example, RF energy supplied by the RF power source 182 may range in frequency from about 13.56 MHz to about 162 MHz or above. For example, non-limiting frequencies such as 13.56 MHz, 27.12 MHz, 40.68 MHz, 60 MHz, or 162 MHz can be used.

In some embodiments, PVD processing system 100 may include a second energy source 183 to provide additional energy to the target assembly 114 during processing. In some embodiments, the second energy source 183 may be a DC power source or a pulsed DC power source to provide DC energy, for example, to enhance a sputtering rate of the target material (and hence, a deposition rate on the substrate). In some embodiments, the second energy source 183 may be a second RF power source, similar to the RF power source 182, to provide RF energy, for example, at a second frequency different than a first frequency of RF energy provided by the RF power source 182. In embodiments where the second energy source 183 is a DC power source, the second energy source may be coupled to the target assembly 114 in any location suitable to electrically couple the DC energy to the target assembly 114, such as the electrode 154 or some other conductive member (such as the source distribution plate 158, discussed below). In embodiments where the second energy source 183 is a second RF power source, the second energy source may be coupled to the target assembly 114 via the electrode 154.

The electrode 154 may be cylindrical or otherwise rod-like and may be aligned with a central axis 186 of the process chamber 104 (e.g., the electrode 154 may be coupled to the target assembly at a point coincident with a central axis of the target, which is coincident with the central axis 186). The electrode 154, aligned with the central axis 186 of the process chamber 104, facilitates applying RF energy from the RF power source 182 to the target assembly 114 in an axisymmetrical manner (e.g., the electrode 154 may couple RF energy to the target at a "single point" aligned with the central axis of the PVD chamber). The central position of the electrode 154 helps to eliminate or reduce deposition asymmetry in substrate deposition processes. The electrode 154 may have any suitable diameter. For example, although other diameters may be used, in some embodiments, the diameter of the electrode 154 may be about 0.5 to about 2 inches. The electrode 154 may generally have any suitable length depending upon the configuration of the PVD chamber. In some embodiments, the electrode may have a length of between about 0.5 to about 12 inches. The electrode 154 may be fabricated from any suitable conductive material, such as aluminum, copper, silver, or the like. Alternatively, in some embodiments, the electrode 154 may be tubular. In some embodiments, the diameter of the electrode 154 may be suitable, for example, to facilitate providing a central shaft for the magnetron.

The electrode 154 may pass through the ground plate 156 and is coupled to the source distribution plate 158. The ground plate 156 may comprise any suitable conductive material, such as aluminum, copper, or the like. The open spaces between the one or more insulators (not shown) allow for RF wave propagation along the surface of the source distribution plate 158. In some embodiments, the one or more insulators may be symmetrically positioned with respect to the central axis 186 of the PVD processing system. Such positioning may facilitate symmetric RF wave propagation along the surface of the source distribution plate 158 and, ultimately, to a target assembly 114 coupled to the source distribution plate 158. The RF energy may be provided in a more symmetric and uniform manner as compared to conventional PVD chambers due, at least in part, to the central position of the electrode 154.

The PVD processing system 100 may further comprise an RF bias power source 134 coupled to the substrate support 106 in order to induce a bias on the substrate 108. The PVD processing system 100 may further comprise a substrate support impedance circuit, such as auto capacitance tuner 136, coupled to the substrate support 106 for adjusting voltage on the substrate 108. For example, the auto capacitance tuner 136 may be used to control the voltage on the substrate 108, and thus, the substrate current (e.g., ion energy at the substrate level).

A controller 194 may be provided and coupled to various components of the PVD processing system 100 to control the operation thereof. The controller 194 includes a central processing unit (CPU) 118, a memory 172, and support circuits 173. The controller 194 may control the PVD processing system 100 directly, or via computers (or controllers) associated with particular process chamber and/or support system components. The controller 194 may be any form of general-purpose computer processor that can be used in an industrial setting for controlling various chambers and sub-processors. The memory, or computer readable medium, 172 of the controller 194 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 173 are coupled to the CPU 118 for supporting the processor in a conventional manner. These circuits include cache, power supplies, clock circuits, input/output circuitry and subsystems, and the like. Inventive methods as described herein, such as the method 200, may be stored in the memory 264 as software routine that may be executed or invoked to control the operation of the PVD processing system 100 in the manner described herein. The software routine may also be stored and/or executed by a second CPU (not shown) that is remotely located from the hardware being controlled by the CPU 118.

While the foregoing is directed to particular embodiments of the present disclosure, other and further embodiments of the disclosure may be devised without departing from the basic scope of the disclosure.

The invention claimed is:

1. A thin film microelectronic device, comprising:
   a substrate having a tungsten gate electrode stack comprising a tungsten silicide nitride film having a formula $W_xSi_yN_z$, wherein x is about 19 to about 22 atomic percent, y is about 57 to about 61 atomic percent, and z is about 15 to about 20 atomic percent.

2. The thin film microelectronic device of claim 1, wherein the tungsten gate electrode stack further comprises a gate oxide layer atop the substrate and the tungsten silicide nitride film disposed atop the gate oxide layer.

3. The thin film microelectronic device of claim 2, wherein the tungsten gate electrode stack further comprises a bulk tungsten layer atop the tungsten silicide nitride film.

4. The thin film microelectronic device of claim 3, wherein a thickness of the bulk tungsten layer is about 2000 to about 5000 angstroms.

5. The thin film microelectronic device of claim 1, wherein a thickness of the tungsten silicide nitride film is about 20 to about 50 angstroms.

6. The thin film microelectronic device of claim 1, wherein the tungsten gate electrode stack has a resistivity of about 7.17 to about 7.27 $\mu\Omega$-cm.

7. A method of processing a substrate disposed in physical vapor deposition (PVD) chamber, comprising:

exposing a substrate having a gate insulating layer to a plasma formed from a first process gas comprising nitrogen and argon;

sputtering silicon and tungsten material from a target disposed within a processing volume of the PVD chamber;

depositing atop the gate insulating layer a tungsten silicide nitride layer having a formula WxSiyNz, wherein x is about 19 to about 22 atomic percent, y is about 57 to about 61 atomic percent, and z is about 15 to about 20 atomic percent; and depositing a bulk tungsten layer atop the tungsten silicide nitride layer.

8. The method of claim 7, wherein a thickness of the tungsten silicide nitride layer is about 20 to about 50 angstroms.

9. The method of claim 7, wherein a thickness of the bulk tungsten layer is about 2000 to about 5000 Angstroms.

10. The method of claim 7, wherein the target has a composition of about 33 wt % tungsten and about 66 wt. % silicon.

11. The method of claim 7, wherein the first process gas comprises about 3 sccm to about 5 sccm of nitrogen.

12. The method of claim 7, wherein the first process gas comprises about 40 sccm to about 45 sccm of argon.

13. The method of claim 7, wherein forming the plasma from the first process gas comprises applying about 500 to about 800 watts of DC power to the target.

14. The method of claim 7, further comprising:

forming a patterned resist layer atop the bulk tungsten layer; and etching the bulk tungsten layer, tungsten silicide nitride adhesion and gate insulating layer to form a tungsten gate electrode stack.

15. The method of claim 14, wherein the tungsten gate electrode stack has a resistivity of about 7.17 to about 7.27 $\mu'\Omega$-cm.

16. A computer readable medium, having instructions stored thereon which, when executed, cause a physical vapor deposition process chamber to perform a method of processing a substrate disposed atop a substrate support within the physical vapor deposition process chamber, the method comprising:

exposing a substrate having a gate insulating layer to a plasma formed from a first process gas comprising nitrogen and argon;

sputtering silicon and tungsten material from a target disposed within a processing volume of the PVD chamber;

depositing a tungsten silicide nitride layer atop the gate insulating layer having a formula $W_xSi_yN_z$, wherein x is about 19 to about 22 atomic percent, y is about 57 to about 61 atomic percent, and z is about 15 to about 20 atomic percent; and depositing a bulk tungsten layer atop the tungsten silicide nitride layer.

17. The computer readable medium of claim 16, wherein depositing the tungsten silicide nitride layer comprises depositing the tungsten silicide nitride layer to a thickness of about 20 to about 50 angstroms.

18. The computer readable medium of claim 16, wherein depositing the bulk tungsten layer comprises depositing the bulk tungsten layer to a thickness of about 5000 angstroms.

19. The computer readable medium of claim 16, further comprising:

forming a patterned resist layer atop the bulk tungsten layer; and etching the bulk tungsten layer, tungsten silicide nitride adhesion and gate insulating layer to form a tungsten gate electrode stack.

20. The computer readable medium of claim 19, wherein the tungsten gate electrode stack has a resistivity of about 7.17 to about 7.27 $\mu'\Omega$-cm.

\* \* \* \* \*